United States Patent [19]

Hornung et al.

[11] 4,277,701
[45] Jul. 7, 1981

[54] SEMICONDUCTOR INTEGRATED INJECTION LOGIC STRUCTURE CONTROLLED BY THE INJECTOR

[75] Inventors: Robert M. Hornung, Ris-Orangis; Gerard M. Lebesnerais, St Fargeau-Ponthierry, both of France

[73] Assignee: International Business Machines Corporation, Armonk, N.Y.

[21] Appl. No.: 924,126

[22] Filed: Jul. 13, 1978

[30] Foreign Application Priority Data

Sep. 28, 1977 [FR] France ................................ 77 29867

[51] Int. Cl.³ .................. H03K 19/091; H01L 27/04; G11C 11/40
[52] U.S. Cl. ................................ 307/291; 307/296 R; 307/303; 307/477; 357/92
[58] Field of Search ............ 357/92; 307/238, 221 R, 307/288, 289, 291, 296 R, 213, 303

[56] References Cited

U.S. PATENT DOCUMENTS

| 3,643,235 | 2/1972 | Berger et al. | 357/92 |
| 3,798,621 | 3/1974 | Baitinger | 307/238 |
| 3,801,967 | 4/1974 | Berger et al. | 357/92 |
| 3,993,918 | 11/1976 | Sinclair | 357/92 |
| 4,056,810 | 11/1977 | Hart et al. | 357/92 |
| 4,156,154 | 5/1979 | Iizuka | 357/92 |
| 4,160,173 | 7/1979 | Aoki | 357/92 |

OTHER PUBLICATIONS

Ho et al., "Latent image . . . ", Electronics, Aug. 16, 1971, pp. 82–85.
Tucci et al., IEEE Journal of Solid State Circuits, Dec. 1976, pp. 847–851.
Hart et al., Philips Technical Review, vol. 33, No. 3, 1973, pp. 76–85.

Primary Examiner—William D. Larkins
Attorney, Agent, or Firm—Wesley DeBruin

[57] ABSTRACT

Integrated Injection Logic (I²L) Structures are disclosed. The disclosure includes integrated injection logic cell structures of the type including an injector and a plurality of adjacent NPN transistors spaced from said injector, characterized in that at least two PNP transistors have different factors $L_B/W_B$, where $L_B$ is the base dimension of the NPN transistor opposite the injector, and $W_B$ is the base width of the PNP transistor of the injector.

1 Claim, 10 Drawing Figures

SEMICONDUCTOR INTEGRATED INJECTION LOGIC STRUCTURE CONTROLLED BY THE INJECTOR

FIELD OF THE INVENTION

This invention relates to semiconductor devices of the integrated injection logic (I²L) type and more particularly, to semiconductor structures wherein an injector serves as a logic control.

BACKGROUND OF THE INVENTION AND PRIOR ART

In 1972, there appeared in the published literature a new type of bipolar logic circuit technology using vertical NPN transistors with multiple collectors operating as inverters, associated with lateral PNP transistors operating as current sources. This logic is known as "Integrated Injection Logic" (I²L). Soon, it appeared that this logic was one of the more important technological innovations of the last years, owing to its various advantages. The advantages are, an excellent figure of merit, a high integration density associated with a real simplicity of design, low power supply voltage requirements, and compatibility with known bipolar processes.

A description of this technology is set forth in the following published articles: "Merged Transistor Logic (MTL)—A Low Cost Bipolar Logic Concept" by Horst H. Berger and Siegfried K. Wiedmann; "Integrated Injection Logic: A New Approach to LSI" by Kees Hart and Arie Slob (IEEE Journal of Solid-State Circuits, Vol. SC-7, No. 5, October 1972, pages 340-351).

Further, this technology and its various applications has been described in a number of U.S. Patents and Publications, a number of which are identified below:

U.S. Pat. No. 3,736,477, entitled "Monolithic Semiconductor Circuit for a Logic Circuit Concept of High Packing Density", granted May 29, 1973 to H. H. Berger et al.

U.S. Pat. No. 3,816,758, entitled "Digital Logic Circuit", granted June 11, 1974 to H. H. Berger et al.

U.S. Pat. No. 3,823,353, entitled "Multi-Layered Vertical Transistor Having Reach-Through Isolating Contacts", granted July 9, 1974 to H. H. Berger et al.

U.S. Pat. No. 3,916,218, entitled "Integrated Power Supply for Merged Transistor Logic Circuit", granted Oct. 28, 1975 to H. H. Berger et al.

U.S. Pat. No. 3,922,565, entitled "Monolithically Integratable Digital Basic Circuit" granted Nov. 25, 1975 to H. H. Berger et al.

U.S. Pat. No. 4,035,664, entitled "Current Hogging Injection Logic", granted July 12, 1977 to H. H. Berger et al.

"Integrated Injection Logic (I²L)" by C. M. Hart et al., Philips Technical Review 33, No. 3, 1973 pages 76-85.

"Terminal-Oriented Model for Merged Transistor Logic (MTL)" by H. H. Berger et al., IEEE Journal of Solid-State Circuits, October 1974, pages 211-217.

"The Injection Model—A Structure-Oriented Model for Merged Transistor Logic (MTL)" by H. H. Berger, IEEE Journal of Solid-State Circuits, Vol. SC-9, No. 5, October 1974, pages 218-227.

"Injection-Coupled Memory: A High-Density Static Bipolar Memory" by S. K. Wiedmann, IEEE Journal of Solid-State Circuits, Vol. SC-8, No. 5, October 1973, pages 332-337.

"Integrated Injection Logic-Present and Future" by N. C. DeTroye, IEEE Journal of Solid-State Circuits, Vol. SC-9, No. 5, October 1974, pages 206-210.

"The Bipolar LSI Breakthrough, Part 1: Rethinking the Problem" by H. H. Berger et al., Electronics, Sept. 4, 1975, pages 89-95.

"The Bipolar LSI Breakthrough, Part 2: Extending the Limits" by H. H. Berger et al, Electronics, Oct. 2, 1975, pages 99-103.

"Bipolar Logic Steps up to LSI, with the Smart Money on I²L", Electronics, Feb. 21, 1974, pages 91-96.

"Bipolar LSI Takes A New Direction with Integrated Injection Logic" by C. M. Hart et al., Electronics Oct. 3, 1974, pages 111-118.

"Integrated Injection Logic—A New Approach to LSI" by N. C. de Troye, 1974 IEEE International Solid-State Circuits Conference, Digest of Technical Papers, pages 12, 13.

"Design Considerations for Merged Transistor Logic (Integrated Injection Logic Circuits)" by H. H. Berger, 1974 IEEE International Solid-State Circuits Conference, Digest of Technical Papers, pages 14, 15.

In integrated injection logic technology, the base circuit is the inverter since the load resistors are cancelled. An associated lateral PNP transistor drives the base of a vertical NPN transistor operating in the reverse mode. The vertical NPN transistor may be provided with multiple collectors.

The structure corresponding to this elementary circuit is conventional. For example, it is described in an article by N. deTroye in the ISSCC Digest of Technical Papers 1974, pages 12, 13 and 214, February 1974, FIG. 1A. In this article, the author emphasizes the influence of the topology, i.e., the arrangement of the multi-collector NPN transistor with respect to the injector, upon the performance of the circuit, and in particular, upon the propagation delays. If the base region is arranged perpendicularly to the injector the latter looks like a rail (FIG. 1A). The current density in the base decreases from the closest collector to the more remote collector due to the voltage drop caused by the base resistance. Therefore, it is the collector closest to the injection rail which will switch the soonest. Conversely, if the base region is arranged in parallel with the injector, all the collectors of a same circuit will receive the same current and thus, will switch at the same speed.

SUMMARY OF THE INVENTION

It is also possible to provide for elementary circuits operating at different switching speeds. For this purpose, one can utilize different topologies. It can be shown that, at a given injector potential (the potential which is connected through a resistor, to the injector which is the emitter of the lateral PNP transistor), the density of the holes injected into the base region of the vertical NPN transistor is inversely proportional to the PNP electrical base width ($W_B$) and proportional to the injection length ($L_B$) which corresponds to the base dimension of the NPN opposite the injector. In other terms, one has:

$$I_c = K \cdot \frac{L_B}{W_B}$$

(where K is a constant)

Therefore, it is possible to vary the injected current in accordance with the horizontal geometry of the lateral PNP transistor and this characteristic can be used for controlling logic circuits.

In effect, if a positive voltage pulse is applied to the injector and assuming that the bases of the various NPN transistors controlled by this injector are not connected, the voltage response gradient on these bases follows the following relation:

$$\frac{dV}{dt} \approx \frac{I_c}{C_B}$$

$I_c$ being the injection current and $C_B$ the capacitance of the emitter-base junction of the vertical NPN transistor.

Also it can be shown that:

$$\frac{I_c}{C_B} \approx \frac{K'}{W_B},$$

In other words, the smaller the distance separating the injector from the base region of the vertical NPN transistor, the steeper is the rise of the voltage response. Thus, it is possible to drive several elementary inverting circuits successively, in accordance with a desired sequence, from the same injector, simply by adjusting correctly the respective base widths of the various PNP transistors.

The injector always operates as a current source but it does not provide the same current to each inverting circuit. The control times are different. Therefore, it is possible to use the inverter as a logic control, for example, in I²L bistable cell of the Eccles-Jordan type with two inverting circuits. Each inverter circuit being provided with two crosswise mounted collectors. The two circuits having different base widths $W_{B1}$ and $W_{B2}$ and being controlled by the same injector. The voltage applied to the injector will set the cell into a predetermined logic state. In this case, it would be possible to consider the injector either as a clear control or as a preset control.

Consequently, a first object of this invention is to propose the use of the injector as a logic control means for integrated injection logic (I²L) circuits.

Another object of this invention is to use the injector as a clear or preset input in an MTL, or I²L bistable cell of the Eccles-Jordan type.

Yet, another object of this invention is to use the injector as a means for presetting an I²L bistable latch of the Eccles-Jordan type, into a predetermined logic state when applying voltage to the circuit.

Yet another object of this invention is to provide an I²L bistable latch of the Eccles-Jordan type with a reduced number of elementary components and a simplified topology.

In accordance with the invention an I²L bistable device of the Eccles-Jordan latch type is provided with two cross-connected transistors controlled by the same injector, characterized in that these transistors are provided with different factors $L_B/W_B$ providing distinct response times, whereby after applying a control pulse through the injector, said device is in a predetermined logic state.

The foregoing and other objects, features and advantages of the invention will be more fully apparent from the following more particular description of a preferred embodiment of the invention, as illustrated in the accompanying drawings.

DESCRIPTION OF THE PREFERRED EMBODIMENTS

Figure 1A:
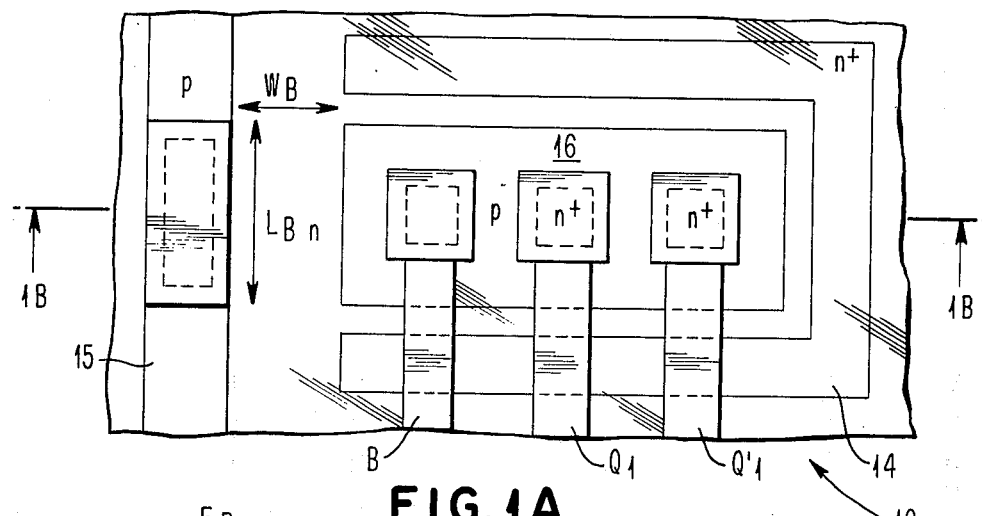
FIG. 1A is a top view of an I²L conventional semiconductor structure representing a basic circuit, i.e., an inverting circuit with two collectors.
Figure 1B:
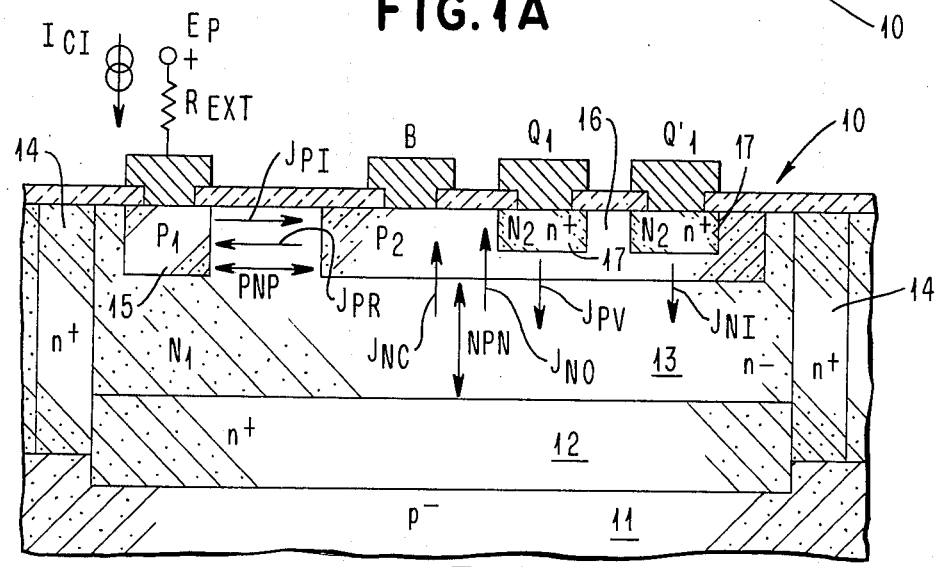
FIG. 1B is a sectional view of the structure shown in FIG. 1A with the section taken along line 1B-1B.

Reference is made to FIGS. 1A and 1B which show a top view and a sectional view of an I²L semiconductor structure representing a conventional inverting device 10.

As known in the art, this inverting circuit is comprised of a vertical NPN transistor which can be provided with several collectors operating in the inverse mode and a lateral PNP transistor which operates as a current source. The process for manufacturing such a structure is conventional since it is perfectly compatible with the bipolar processes known in the art. Although not within the scope of this invention, a suitable process will be briefly summarized below. It includes the following steps:

1. Forming a type P semiconducting substrate (11),
2. Forming a heavily doped type N buried layer (12),
3. Forming a type N epitaxial layer (13),
4. Diffusing heavily doped type P isolating walls (this step is required if the I²L technology is combined with other bipolar technologies such as TTL, ECL, etc. Said isolating walls are not shown in the drawing.)
5. Diffusing heavily doped type N reach-through regions (14) to reduce the parasitic currents of the base of the vertical NPN transistor which operates in the reverse mode.
6. Diffusing type P regions to form injector (15) which is rail shaped in this case, and base (16) of the NPN transistors.
7. Diffusing heavily doped type N shallow regions to form collector contact regions (17), and
8. Forming the contacts and metal conductors according to the desired configuration.

Figure 1C:
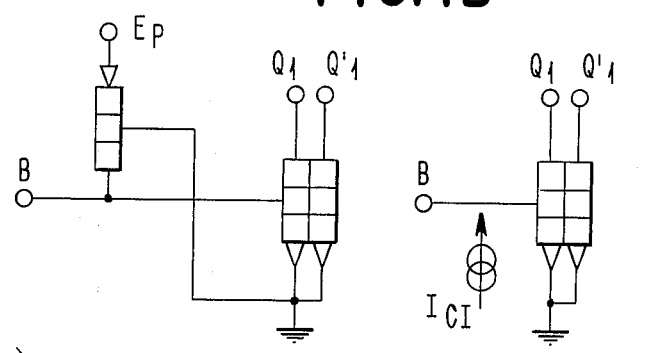
FIG. 1C shows first and second circuit diagrams for representing the structure of FIG. 1.

In FIGS. 1A and 1B, the lateral PNP transistor is comprised of regions P1(15), N1(13), P2(16), and the vertical NPN transistor is comprised of regions N1(13), P2(16), N2(17). The NPN transistor operates in the inverse mode. The emitter of the PNP transistor is injector P1. The base N1(13) of the PNP transistor is merged with the emitter of the NPN transistor. The epitaxial layer N1(13) is connected to the ground through buried layer 12 and reach through regions 14. The regions 14 being heavily doped are, therefore, not very resistive. The collector P2(16) of the PNP transistor is the base of the NPN transistor. The vertical NPN transistor is provided with two collector regions (17). An equivalent electric circuit diagram is shown in FIG. 1C in two forms: on the one hand, with the PNP transistor and, on the other hand, with a current generator which emphasizes the function of the lateral PNP transistor.

The device operates as follows: the PNP transistor comprised of regions P1 N1 P2 operates as a current source, the junction P1 N1 is forward biased and a hole current is injected from region P1 into region N1. When base P2 is not connected, said hole current ensures a forward biasing of the junction P2 N1, which forces the vertical NPN transistor to conduct. The emitter N1 of the NPN transistor being at the ground potential. On the other hand, when the base contact potential of the NPN transistor is at the low level, the holes injected into region P2 are directed towards the contact B of the base region and the NPN transistor is inhibited.

FIG. 1B shows the various currents involved in terms of current densities. Current $J_{PI}$ is the lateral hole injection between injector P1 and base P2 of the NPN transistor, $J_{PR}$ is the hole current which is reinjected or returned by base P2 towards the injector, $J_{NC}$ and $J_{NO}$, respectively, are the electron currents emitted by emitter N1 of the NPN transistor toward metal contact B and the oxide-covered portions of base P2. $J_{PV}$ is the vertical hole injection and $J_{N1}$ is the electron injection into the intrinsic base of the NPN transistor.

However, the most important current is the one which goes through the injector, i.e., current $I_{CI}$ of the lateral PNP transistor which can be written as follows:

$$I_{CI} = A_E \cdot J_{CI}$$

where $A_E$ is the injection surface area. The value of current $J_{CI}$ which depends on currents $J_{PR}$ and $J_{PI}$ is given by the well known equation of the collector current of a transistor the base of which is evenly doped, i.e.:

$$J_{CI} = \frac{q\, n_i^2}{N_D} \frac{D_P}{W_B} [\exp(\frac{qV}{kT}) - 1]$$

then:

$$I_{CI} = A_E q\, n_i^2 \frac{D_P}{N_D W_B} [\exp(qV/kT) - 1] \tag{1}$$

q being the electron charge, k the Boltzmann constant $D_p$ the hole diffusion constant, $N_D$ the concentration in the base of the PNP transistor (i.e. the epitaxial layer), $W_B$ the electric base width and V the voltage across the junction terminals. Equation (1) is applicable when $W_B << L_P$ (hole diffusion length in the epitaxial layer).

In a practical embodiment where $W_B \simeq 5$ μm, $L_p = 50$–60 μm and the resistivity of the epitaxial layer is of about 1 Ω·cm, this equation remains applicable. Additional information can be found in the article entitled "The Injection Model, a Structure Oriented Model for MTL" by H. H. Berger, IEEE ISSC, Vol.—SC9, No. 5, October 1974.

Equation (1) can be also written as follows since $A_E = L_B \cdot r_j$, $r_j$ being the depth of the junction formed by regions P1 and P2 in the epitaxial layer (therefore, a determined value):

$$I_{CI} = \frac{q \cdot r_j D_P n_i^2}{N_D} (\exp(\frac{qV}{kT}) - 1) \cdot \frac{L_B}{W_B} = k1 \cdot \frac{L_B}{W_B} \tag{2}$$

Thus, it is possible to modify the quantity of injected current by modifying the horizontal geometry of the device.

Another important characteristic of the lateral PNP transistor is the capacitance of the associated emitter/base junction. The excess hole concentration close to the depletion layer formed by the emitter-base junction of the PNP transistor, at low potentials, can be written as follows:

$$\overline{P_o} = \frac{n_i^2}{N_D} [\exp(qV/kT) - 1] \tag{3}$$

This relation allows the reader to understand the behaviour of the PNP transistor when the switching operation is performed.

In effect, $$C = \frac{dQ}{dV} \tag{4}$$

with $$Q = \tfrac{1}{2} \overline{P_o} W_B A_E q \tag{5}$$

Q being the charge stored into the intrinsic base of the lateral PNP transistor. The hole concentration is linear in said base and is null at the collector-base junction as is well known in the art. The charge stored under the injector, i.e. in epitaxial area (13) located between diffusion P1(15) and buried layer (12) is not taken into account in this simplified calculation. It is assumed that the injector width is kept constant, therefore, the capacitance associated with the charges located under the injector, is also constant and is not taken into account.

Capacitance C can be written as follows:

$$C = \frac{dQ}{dV} = d\left(\frac{\tfrac{1}{2} \overline{P_o} \cdot W_B A_E q}{dV}\right) = \tfrac{1}{2} \frac{q^2 n_i^2}{kT} \cdot \frac{1}{N_D} A_E (\exp(\frac{qV}{kT}) ) W_B$$

which becomes by using (1):

$$C \approx \tfrac{1}{2} \frac{q I_{CI}}{kT} \frac{W_B^2}{D_P} \tag{6}$$

The current injected into the lateral PNP transistor is available to the vertical NPN transistor sooner or later according to the value of capacitance C. The capacitance C is a function of the square of the PNP transistor base width $W_B$. The NPN transistor will be able to conduct only when its emitter-base capacitor $C_B$ is charged.

Figure 2:
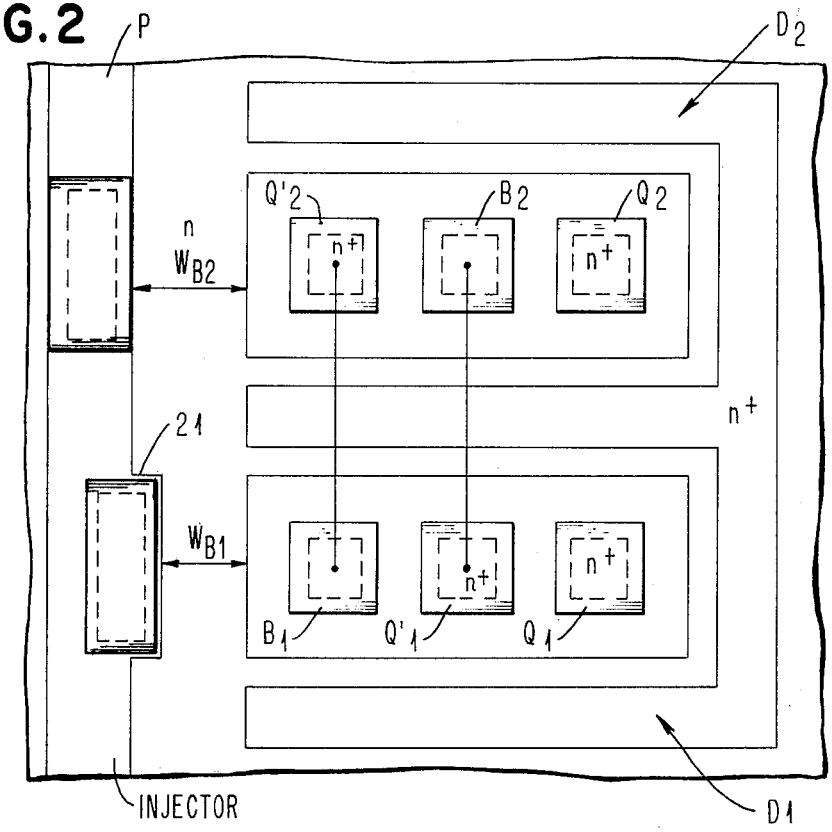
FIG. 2 is a top view of a semiconductor cell provided with two base circuits, fed by the same injector and showing different base widths $W_B$, in accordance with this invention.

Now refer to FIG. 2 which shows a top view of a structure comprised of two base inverting circuits, each similar to the one described in FIG. 1, and embodying the principle of this invention. The two base inverting circuits of FIG. 2 each have different base widths $W_B$. Base width $W_{B1}$ of device D1 is smaller than base width $W_{B2}$ of device D2. Base contacts B1 and B2 and collector contacts $Q_1$, $Q_1'$ and $Q_2$, $Q_2'$ complete the assembly. The injector is common. It should be noted that the injection rail is provided with a protrusion 21 in order to adjust the desired base width in device D1. Conversely, it would be possible to expand the diffusion in the base of D2 towards said rail to obtain the same result.

If a positive voltage pulse is applied to the injector, and if both bases B1 and B2 are not connected, the rise of the potential of a contact $B_i$ (i=1 or 2) will follow the following relation:

$$\frac{dV}{dT} \approx \frac{I_{CI}}{C_B} \quad (7)$$

where $C_B$ is the emitter-base capacitance of the NPN transistor at low voltages (or the transition capacitance of the emitter-base junction). In this case, this capacitance can be considered as constant, therefore:

$$\frac{I_{CI}}{C_B} \approx \frac{k_2}{W_B} \text{ from (1)}$$

then, $$\frac{dV}{dT} \approx \frac{k_2}{W_B} \quad (8)$$

Consequently, the response of node B1 will be faster than that of node B2. Thus, it is possible to obtain different response delays simply by modifying the base width of various PNP transistors.

Electric base width $W_B$ is readily obtained by plotting line $1/I_{CI}$ according to V. Its abscissa $x_0$ for $/1/I_{CI}=0$ should be subtracted from the width of metallurgy base $W_M$, in other words $W_B = W_M - x_0$.

Base width $W_B$ being directly linked to the gain of the PNP transistor, its value will be chosen so that the gain is $\geq 2$. Thus, owing to this structural difference, with a same injection bias Ep, the base of the NPN transistor of D1 receives a current stronger than the base of the NPN transistor of D2, which results in addition from equation (8), in a smaller propagation delay and in a higher switching speed. This characteristic will be used for designing bistable devices of the latch type showing a simplified topolgy and a reduced number of elementary components. Similar results could be obtained from $L_B$, i.e., either by using elementary devices of different dimensions or by dividing the injector into a plurality of injectors connected to Ep.

Figure 3:
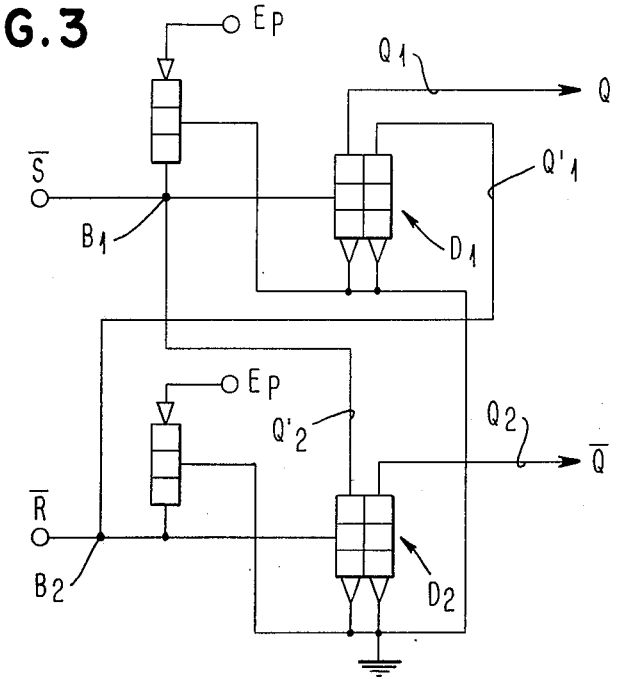
FIG. 3 shows the circuit diagram of an I²L bistable cell of the Eccles-Jordan type in accordance with this invention.

Now refer to FIG. 3 which shows a memory cell of the bistable latch type RS comprised of two devices D1 and D2 cross-connected so that output $Q'_1$ is connected to base B2 of device D2 and output $Q'_2$ is connected to base B1 of device D1. Both devices are driven from the same injection rail connected to a single injection potential or bias Ep. Bases B1 and B2, respectively, form inputs $\overline{S}$ and $\overline{R}$ of the cell. Outputs Q and $\overline{Q}$ are available from terminals $Q_1$ and $Q_2$, respectively.

This cell operates as follows. Before applying the injection current (Ep=0 V), both devices are inhibited, outputs Q and $\overline{Q}$ are in the logic "one" state. When the injection current (Ep=0.7 V) is applied, D1 conducts ($\overline{R}=0$) prior to D2, thus one has Q=1. In other words, each time potential Ep is applied (for instance when applying power supply to the circuit), the memory cell is set into a predetermined state.

Thus, the injector can be used as a logic control for presetting all the memory cells of a sequential logic block. These memory cells can be of any type (master-slave, T, RS, D, JK). Thus, it should be noted that the injector can be considered, either as a preset control (under the application of Ep, Q=1), or as a clear control (under the application of Ep, R=$\overline{Q}$=0).

This choice allows those skilled in the art to design different circuits and, in particular, in the applications relative to complex memory cells.

Figure 4A:
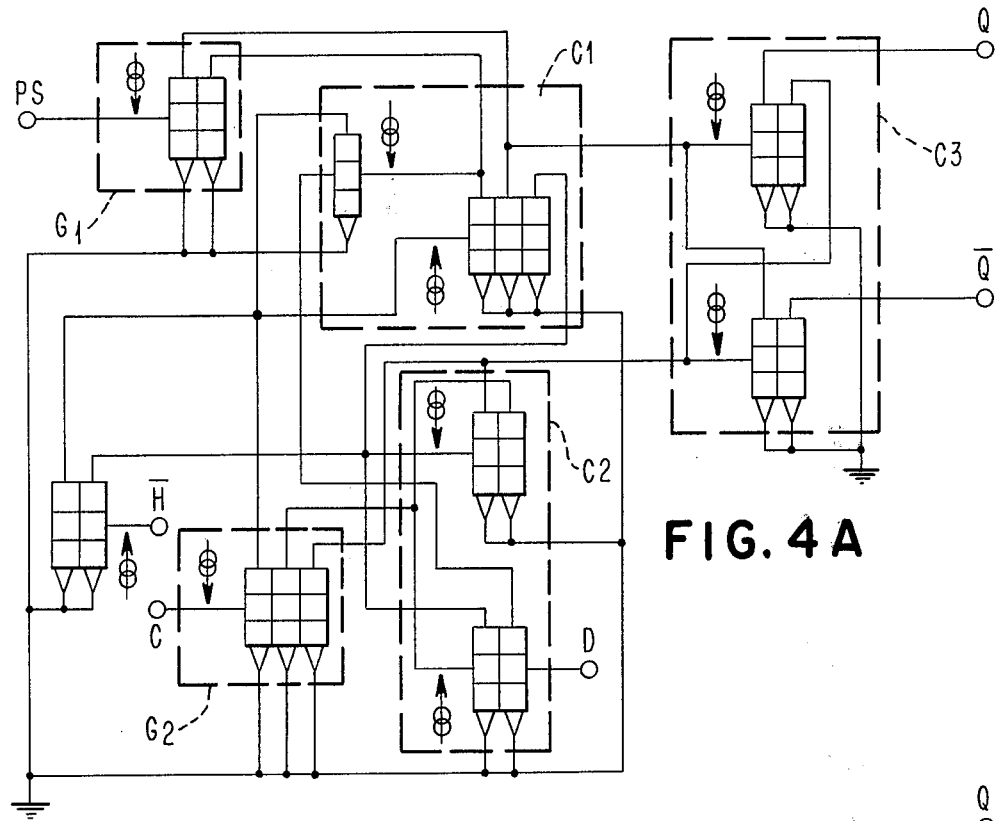
FIG. 4A shows the circuit diagram of an I²L type D bistable latch of the prior art.

FIG. 4A shows a conventional type D bistable latch which is set on the rise of the clock. An $I^2L$ type D latch is described in the review "Electronics", Feb. 6, 1975, page 87. The clear (C) and preset (PS) functions as well as the clock (H) and data (D) inputs are represented. The injection means are represented in a simplified manner. Therefore, this type D latch includes three conventional $I^2L$ type RS latches. Two of these latches, C1 and C3, are driven through gate G1 for presetting latch C3 (Q=1), and the three latches are driven through gate G2 for clearing it (Q=0). All the lateral PNP transistors have the same base width. This circuit requires 19 NPN transistors, in fact 9 elementary devices.

Figure 4B:
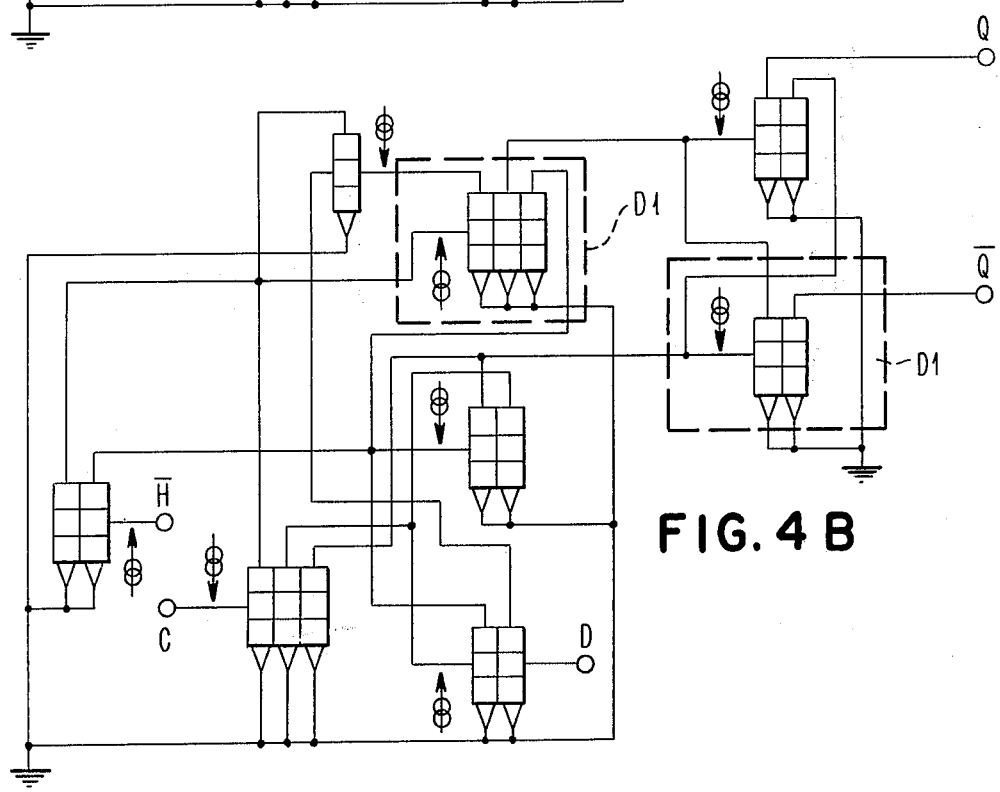
FIGS. 4B and 4C show the circuit diagrams of a type D bistable latch improved in accordance with this invention.
Figure 4C:
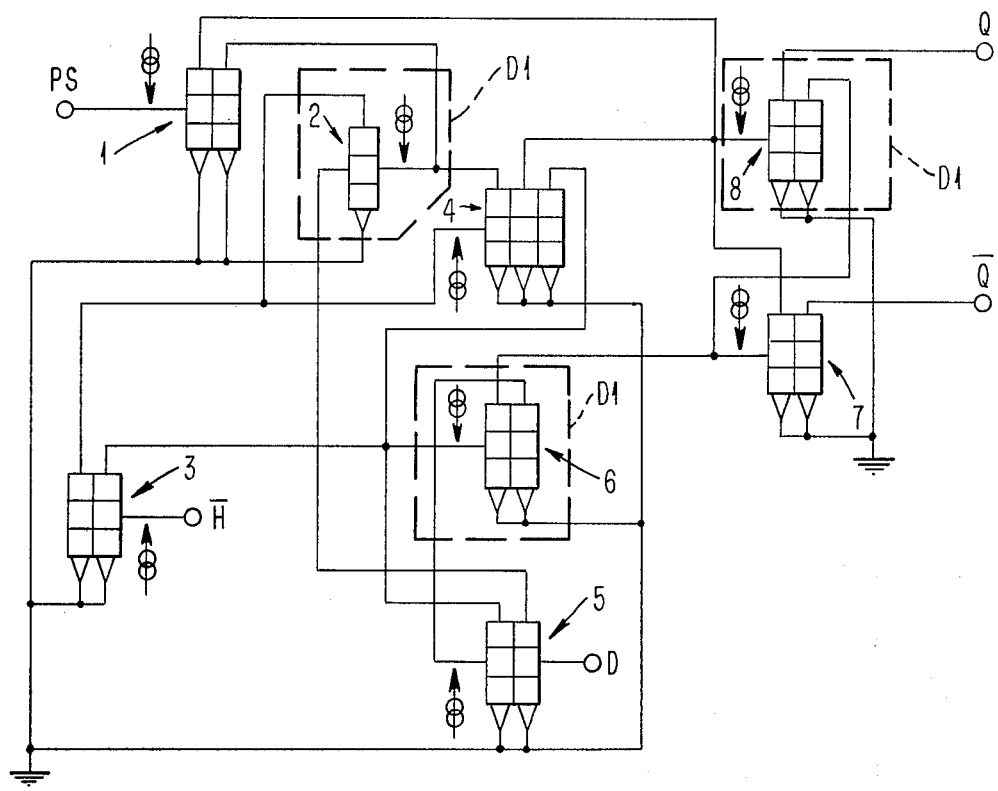

The same latch is shown in FIGS. 4B and 4C with the injector respectively used as a presetting control (input PS) and as a clearing control (input C). Thus, in order to ensure the presetting function (FIG. 4B), gate G1 is cancelled in the conventional latch (FIG. 4A) and gate in each of the latches C1 and C3 is of inverter type D1. To ensure the clearing function (FIG. 4C), gate G2 is cancelled as well as a gate in each of the latches C1 and C2. Latch C3 employs an inverter of type D1. Consequently, these two functions controlled by the injector are performed directly within the cells forming latch D without any control signal going through gates G1 or G2. The circuits using the inverters of type D1 are clearly shown in the figures. The latches shown in FIGS. 4B and 4C require only eight elementary devices.

Thus, the preset or clear functions can be provided by the injector. For this purpose, it is sufficient to carry out a slight modification of the topology of certain lateral PNP transistors, namely by modifying their base width. Among the various advantages of this invention, one should particularly note the reduced dimensions of the device. This directly leads to an increase in the integration density.

In effect, the clear or preset function ensured by the injector saves one control device in the case of a latch of type D (FIGS. 4B and 4C), i.e., provides a reduction in the order of 10% in semiconductor surface area required.

This gain of space (semiconductor surface area) is combined with the simplification of the metallurgy patterns used for wiring said devices.

Figure 4D:
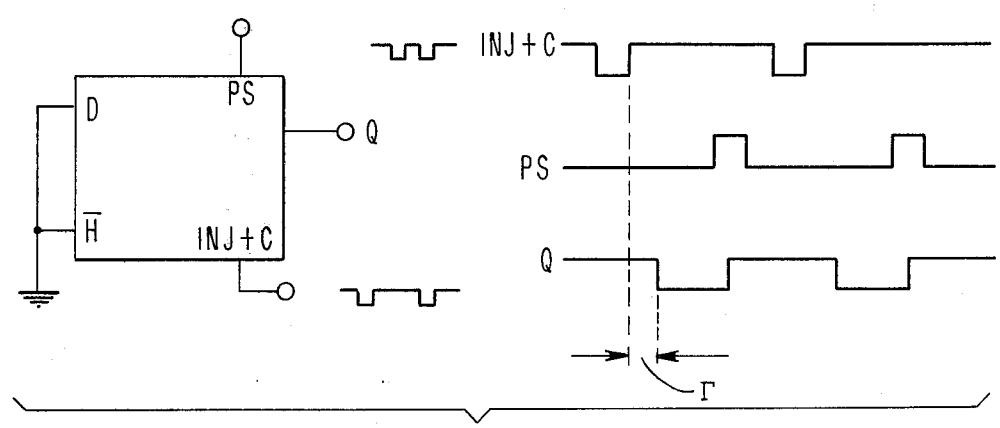
FIG. 4D schematically shows the control pulses and responses of the type D latch shown on FIG. 4C.

FIG. 4D shows a diagram of the control and response pulses of a type D latch as shown in FIG. 4C. The clear control under the influence of the injector levels is well emphasized.

The time diagrams of FIG. 4D show how latch D can be successively set into logic state 1 (Q=1) by a positive pulse applied to preset input PS and into logic state 0

(Q=0) by a negative pulse applied to injector INI+C also operating as a clearing input. As explained above, the clear function is performed on the rise of the negative pulse applied to the injector and with a delay $\gamma$ the value of which depends on the potential of the injector in the high level. The higher the injector potential, the greater is the injected current and the smaller is delay $\gamma$. It was possible to provide $\gamma$ values between 150 ns and 400 ns.

Figure 5:
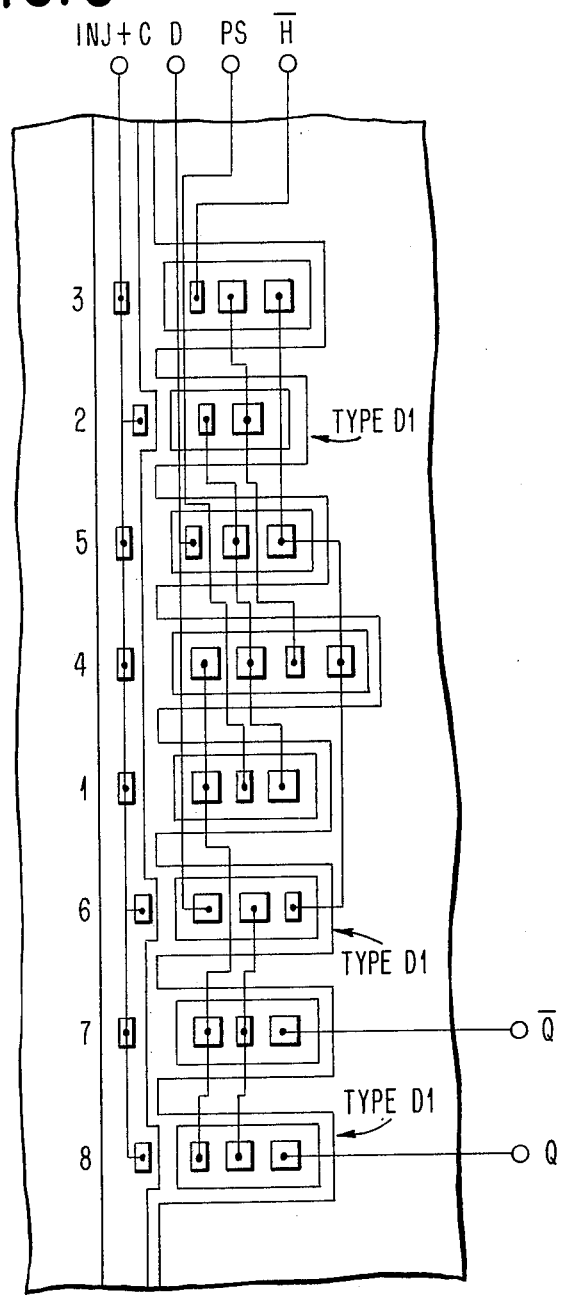
FIG. 5 shows the real topology of an MTL integrated latch corresponding to the circuit diagram of FIG. 4C.

The topology of a device of the type shown in FIG. 4C is given on FIG. 5. The elementary devices are referenced from 1 to 8. Inverting circuits 2, 6 and 8 are of type D1.

A practical application of the invention can be found in an analog to digital converter.

The analog-to-digital conversion (ADC) can be performed by applying the successive approximation technique and then, the use of a sequential circuit which may be a shift register. Before carrying out the conversion, the circuit is initiated and after application of the starting signal, the circuit should be in the 10000000 state in the case of an ADC of 8 bits. In this case, the injection rail controls the entire logic of the shift register in I²L technology.

By lowering voltage Ep to 0, then by increasing it to 0.7 V, the injection rail acts as the clear control (Q=0) for the cells of the type shown in FIG. 4C and as a preset control (Q=1) for the cells of the type shown on FIG. 4B.

In general, this concept can be applied in all bistable devices in which a predetermined state is to be set under the application of a predetermined voltage which may be the application of power to the device. In addition, this technique simplifies and reduces the number of the elementary devices and consequently, the complexity of the metallurgy patterns. It is also possible to apply this technique to memories, shift registers, counters, etc.

Various other modifications to the disclosed embodiment as well as alternate embodiments of the present invention may become apparent to one skilled in the art without departing from the spirit and scope of the invention as defined by the appended claims.

Having thus described our invention, what we claim as new, and desire to secure by Letters Patent is:

1. A monolithic semiconductor bistable device having first and second stable states of conductivity, said bistable device comprising:
   a first integrated injection logic unit including a lateral PNP transistor and a vertical NPN transistor having an emitter, base and first and second collectors;
   a second integrated injection logic unit including a lateral PNP transistor and a vertical NPN transistor having an emitter, base and a single collector;
   a third integrated injection logic unit including a lateral PNP transistor and a vertical NPN transistor having an emitter, base and first and second collectors;
   a fourth integrated injection logic unit including a lateral PNP transistor and a vertical NPN transistor having an emitter, base and first, second and third collectors;
   a fifth integrated injection logic unit including a lateral PNP transistor and a vertical NPN transistor having an emitter, base and first and second collectors;
   a sixth integrated injection logic unit including a lateral PNP transistor and a vertical NPN transistor having an emitter, base and first and second collectors;
   a seventh integrated injection logic unit including a lateral PNP transistor and a vertical NPN transistor having an emitter, base and first and second collectors;
   an eighth integrated injection logic unit including a lateral PNP transistor and a vertical NPN transistor having an emitter, base and first and second collectors;
   First connection means connecting in common said emitters of said NPN transistors of said first through eighth units and a source of reference potential;
   second connection means connecting in common said first collector of said NPN transistor of said first unit, said second collector of said NPN transistor of said fourth unit, said first collector of said NPN transistor of said seventh unit and said base of said NPN transistor of said eighth unit;
   third connection means connecting in common said first collector of said NPN transistor of said third unit, said collector of said NPN transistor of said second unit, and said base of said NPN transistor of said fourth unit;
   fourth connection means connecting in common said second collector of said NPN transistor of said first unit, said first collector of said NPN transistor of said fourth unit, said base of said NPN transistor of said second unit, and said second collector of said NPN transistor of said fifth unit;
   fifth connection means connecting in common said second collector of said NPN transistor of said third unit, said third collector of said NPN transistor of said fourth unit, said base of said NPN transistor of said sixth unit, and said first collector of said NPN transistor of said fifth unit;
   sixth connection means connecting in common said second collector of said NPN transistor of said eighth unit, said base of said NPN transistor of said seventh unit and said first collector of said NPN transistor of said sixth unit;
   seventh connection means connecting in common said second collector of said NPN transistor of said sixth unit and said base of said NPN transistor of said fifth unit;
   first and second complementary output terminals (Q,$\overline{Q}$), said first output terminal (Q) being connected to said second collector of said NPN transistor of said eighth unit, said second output terminal ($\overline{Q}$) being connected to said second collector of said NPN transistor of said seventh unit;
   a preset control input (PS) terminal connected to the base of said NPN transistor of said first unit;
   a clock input (H) terminal connected to the base of said NPN transistor of said third unit;
   a data input (D) terminal connected to the base of said NPN transistor of said fifth unit;
   an injector and clearing input (INJ+C) terminal connected in common to the emitter of each of said lateral PNP transistors of said first through eighth Integrated Injection Logic units;
   said bistable device being further characterized in that the base width of each of the PNP transistors of said second, sixth and eighth units are respectively equal one to another, that the base width of each of the PNP transistors of said first, third, fourth, fifth and seventh units are respectively equal one to another, and that the base width of each of the PNP transistors of said second, sixth and eighth units is less than the base width of each of the PNP transistors of said first, third, fourth, fifth and seventh units; and said bistable device being still further characterized in that a positive pulse, applied to said preset control input terminal causes said monolithic semiconductor bistable device to assume said first stable state (Q=1) and a negative pulse applied to the injector and clearing input terminal causes said monolithic semiconductor bistable device to assume said second stable state (Q=0).

* * * * *